(12) United States Patent
Davis et al.

(10) Patent No.: US 6,581,183 B1
(45) Date of Patent: Jun. 17, 2003

(54) SYSTEM AND METHOD FOR RESYNCHRONIZATION OF TRANSMIT AND RECEIVE COMPRESSION DICTIONARIES

(75) Inventors: Gordon Taylor Davis, Chapel Hill, NC (US); Malcolm Scott Ware, Raleigh, NC (US); Charles Robert Young, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/539,105

(22) Filed: Mar. 30, 2000

(51) Int. Cl.⁷ .......................... H03M 7/30; H03M 13/09
(52) U.S. Cl. ...................................................... 714/798
(58) Field of Search ................................ 714/798, 807

(56) References Cited

U.S. PATENT DOCUMENTS

| | | | | |
|---|---|---|---|---|
| 3,979,719 A | * | 9/1976 | Tooley et al. ................ 714/748 |
| 5,130,993 A | * | 7/1992 | Gutman et al. .............. 714/775 |
| 5,153,591 A | * | 10/1992 | Clark ........................... 341/51 |
| 5,177,480 A | | 1/1993 | Clark ........................... 341/51 |
| 5,323,155 A | | 6/1994 | Iyer et al. ...................... 341/51 |
| 5,424,732 A | | 6/1995 | Iyer et al. ...................... 341/51 |
| 5,608,396 A | * | 3/1997 | Cheng et al. ................. 341/50 |
| 5,608,779 A | | 3/1997 | Lev et al. ..................... 379/88 |
| 5,715,260 A | * | 2/1998 | Black et al. ................. 714/798 |
| 5,768,533 A | * | 6/1998 | Ran ............................. 709/247 |
| 5,774,483 A | * | 6/1998 | Hwang ........................ 714/815 |
| 5,831,558 A | | 11/1998 | Harvell ....................... 341/106 |
| 5,850,565 A | | 12/1998 | Wightman ................... 315/821 |
| 5,875,202 A | * | 2/1999 | Venters et al. .............. 714/807 |
| 5,973,630 A | | 10/1999 | Heath ........................... 341/87 |
| 6,067,381 A | * | 5/2000 | Benayoun et al. .......... 382/232 |
| 6,141,324 A | * | 10/2000 | Abbott et al. ............... 370/236 |

\* cited by examiner

*Primary Examiner*—Stephen M. Baker
(74) *Attorney, Agent, or Firm*—Whitham, Curtis & Christofferson, PLC; Scott W. Reid

(57) ABSTRACT

Broadband modems using data compression insure the physical connection between modems is solid prior to initiating error recovery procedures since its error detection runs on the compressed data. Escape sequences applicable to Transparent Mode of the Compression function enable both duplex and simplex compression functions and provide a more reliable mechanism for completion of error recovery procedures in the presence of subsequent line disturbances. Transparent Mode is used during the re-synchronization procedure. No special compression code words are required to accomplish the procedure, and there is no reduction in the number of code words available for actual compression encoding. The procedure works regardless of whether compression is being used in both directions, only one direction, or neither direction. A new Transparent Mode Command to request that the remote modem send a RESET Command is defined. The new command is termed RRESET.

18 Claims, 3 Drawing Sheets

SYSTEM AND METHOD FOR RESYNCHRONIZATION OF TRANSMIT AND RECEIVE COMPRESSION DICTIONARIES

CROSS-REFERENCE TO RELATED APPLICATION

The subject matter of this application is related to the disclosure of U.S. patent application Ser. No. 09/538,204 filed concurrently herewith by Gordon T. Davis, Malcolm S. Ware and Charles R. Young for "Data Compression Over Communications Links Which are Exposed to Occasional Errors" and assigned to a common assignee herewith. The disclosure of application Ser. No. 09/538,204 is incorporated herein by reference.

DESCRIPTION

BACKGROUND OF THE INVENTION

1. Field of the Invention

The present invention generally relates to communication systems and, more particularly, to data communication systems which enable data compression and allow re-synchronization of transmit and receive compression dictionaries when an error is detected, without disrupting the connection.

2. Background Description

Data compression is widely used in voice-band modems today, using an international standard; i.e., International Telecommunications Union-Telecommunications Services Sector (ITU-T)(formerly Consultative Committee on International Telephone and Telegraphy (CCITT)) V.42bis. An example of a voice-band modem using data compression based on the well-known Lempel/Ziv algorithm is described in U.S. Pat. No. 4,814,746 to Victor S. Miller et al. for "Data Compression Method". In particular, the Miller et al. patent describes communications between a host computing system and a number of remote terminals. According to the Miller et al. patent, this communication is enhanced by a data compression method which modifies the data compression method of Lempel and Ziv by addition of new character and new string extensions to improve the compression ratio, and deletion of a least recently used routine to limit the encoding tables to a fixed size to significantly improve data transmission efficiency.

A system requirement in these systems is that the data processed by the receiving data compression unit must be free of errors. Otherwise, the receive dictionary in that modem will get out of sync with the transmit dictionary in the modem at the other end of the communications link. Voice-band modems typically address this issue by adding an error control function (i.e., V.42, MNP 4) which detects errors and requests retransmission of data blocks received in error.

U.S. Pat. No. 5,130,993, to Michael Gutman et al. for "Transmitting Encoded Data on Unreliable Networks" describes a system in which information encoded by data compression (or another data encoding technique, e.g., encryption, requiring synchronization between the encoder and decoder) is transmitted over an unreliable network by checking for transmission errors after decoding. If an error is detected, the encoder is reset, using a reset protocol which may operate over an unreliable reverse channel by using a timer to generate further reset requests when the receiver does not acknowledge them in a timely fashion.

Although the Gutman et al. patent describes a procedure for re-synchronizing transmit and receive compression dictionaries, it places the error detection function outside of the error compression function, making it impossible to ensure that the link has recovered from a disturbance prior to initiating error recovery procedures. The Gutman et al. patent also requires the use of compression code words in the error recovery procedure, thus reducing the number of dictionary entries available for user data and forcing the link to operate with compression in both directions.

SUMMARY OF THE INVENTION

It is therefore an object of the present invention to provide recovery procedures that resynchronize the transmit and receive dictionaries when an error is detected, without disrupting the connection in the other direction.

It is another object of the invention to provide in a broadband data communication system supporting error detection running on compressed data a way to insure the physical connection between transceivers is solid prior to initiating error recovery procedures.

It is further object of the invention to make use of Escape sequences applicable to Transparent Mode of the Compression function, enabling both duplex and simplex compression functions, and providing a more reliable mechanism for completion of error recovery procedures in the presence of subsequent line disturbances.

The subject invention uses the Transparent Mode (TM) during the re-synchronization procedure. No special compression code words are required to accomplish the procedure, and there is no reduction in the number of code words available for actual compression encoding. The procedure works regardless of whether compression is being used in both directions, only one direction, or neither direction. The invention defines a new Transparent Mode Command to request that the remote modem send a RESET Command. The new command is termed RRESET. If Transceiver B detects a CRC (Cyclic Redundancy Code) error in the data it receives from Transceiver A, Transceiver B receiver will signal Transceiver B transmitter of the Error Event.

In a preferred embodiment employing broad band modems as the transceivers, the modem data pump receiver, upon detection of a CRC error, discards the affected data block without forwarding it to the receiver Data Decompression function. Thus, the Modem B receiver Data Decompression function only sees the CRC error signal from the data pump, but never sees the corrupted data. This will cause Modem B transmitter to switch to Transparent Mode (if currently in Compression Mode), and to send one or more RRESET commands to initialize the re-synchronization procedure. When detected in the received bit stream at Modem A, the RRESET command causes the Modem A receiver to signal the Modem A transmitter within that modem. Modem A transmitter, in response to that signal, will switch to Transparent Mode (if currently in Compression Mode), and send one or more RESET commands to Modem B which had made the request, and then reset its transmit compression dictionary. When Modem B receiver detects the RESET command, it resets its receive compression dictionary, so that it is in synchronization with Modem A transmit compression dictionary again, thus completing the re-synchronization procedure. The net result is that the Modem A transmit compression dictionary and Modem B receive compression Dictionary are reset, but the compression dictionaries used for the reverse path are not affected, thus avoiding the potential of lost compression effectiveness in the reverse direction due to the recovery procedure. At the end of the re-synchronization procedure, both directions of communication are left in Transparent Mode.

Previously defined mechanisms (i.e., V.42 bis) will test the compression capabilities in each direction, and will switch back to Compression Mode when (and if) the data stream and dictionary contents allow it. The communications path from Modem B to Modem A will most likely switch back to Compression Mode first, since previous content of its Compression Dictionary is retained during the re-synchronization procedure, while the Compression Dictionary for sending from Modem A to Modem B is purged of any previous content as a consequence of the Reset operation. Note that this same procedure will also re-synchronize the ESC character when the modems are operating in Transparent Mode.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
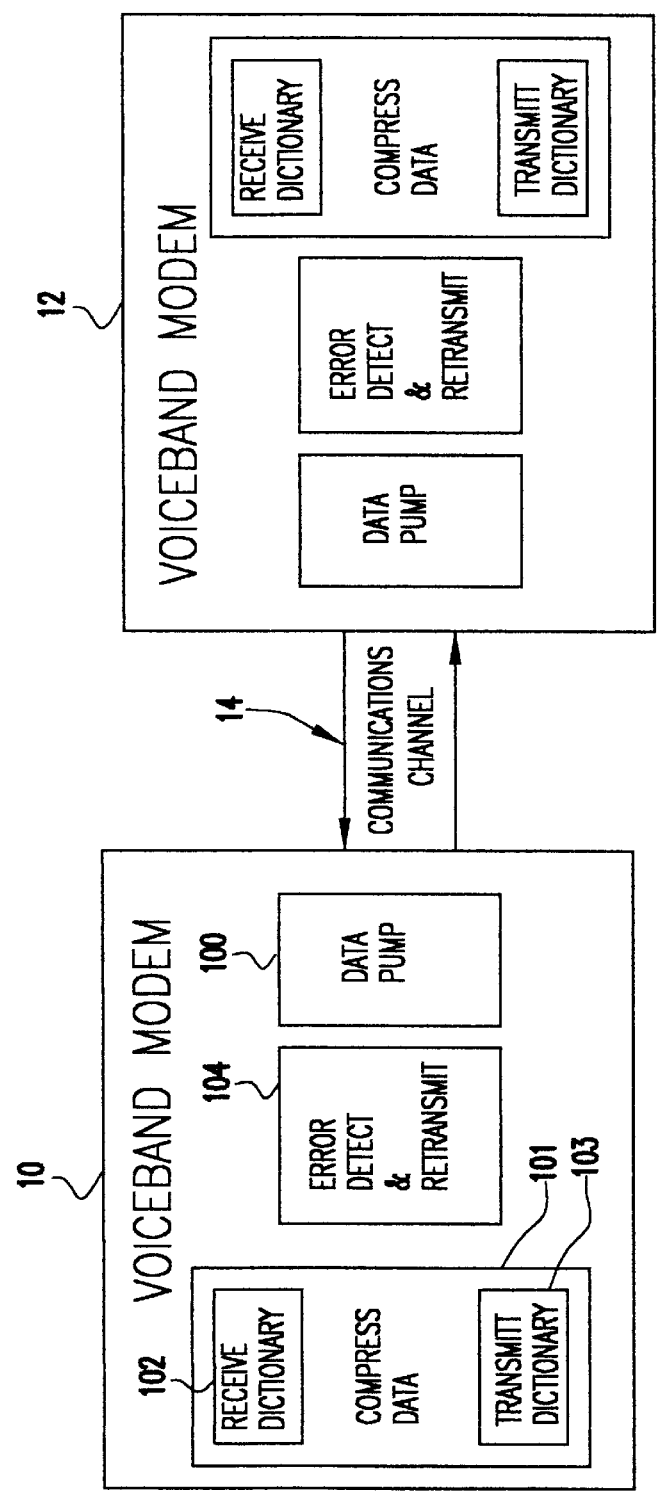
FIG. 1 is a block diagram of a voice-band modem communication system with data compression and error control.

Referring now to the drawings, and more particularly to FIG. 1, there is shown a voice-band modem system with data compression and error control. In FIG. 1, two voice band modems (for "modulator/demodulator") 10 and 12 are connected at either end of a communication channel 14. Taking modem 10 as typical, a data compression method 101 having a receive dictionary 102 and a transmit dictionary 103 is employed to compress and decompress data transmitted and received by the modem. The modem also includes an error detection and re-transmit function 104 which, when an error is detected, requests re-transmission of the data. Finally, the modem includes a data pump 100 which maintains synchronization of the transmitted and received data.

Although the error control functions typically used are not foolproof, they limit errors to be infrequent enough (typically less than one during a 24 hour day) that if the connection crashed, it does not create a major problem. A variation on FIG. 1 is disclosed in U.S. Pat. No. 5,130,993 to Gutman et al., where the order of Data Compression and Error Detection/Retransmit are reversed, requiring the compression function to deal with the possibility of corrupted data. However, the method of dealing with corrupted data described in the Gutman et al. patent is somewhat different than the methods implemented by this invention.

Data compression is typically not applied in broadband communications systems. Such systems more typically use Forward Error Correction (FEC) algorithms such as Reed-Solomon coding to minimize errors to an acceptable level, but it is important to note that a small but statistically significant percentage of errors experienced in such a system are uncorrectable. Even though error-free operation is typically not achieved, Forward Error Correction is the preferred approach in high-speed systems, because it can be implemented without significant data buffering requirements, while typical error recovery with retransmission of corrupted data blocks requires significant buffering of data in transit. In fact, the higher the data rate is on the communications channel, the larger the number of data blocks in transit are, and the larger the buffering requirements become. At a minimum, error recovery procedures require buffering capacity equal to the amount of data which can be transmitted in time T, where T is the round-trip delay time through the communications channel plus propagation, delay times through both transmit and receive circuits in both modems.

Figure 2:
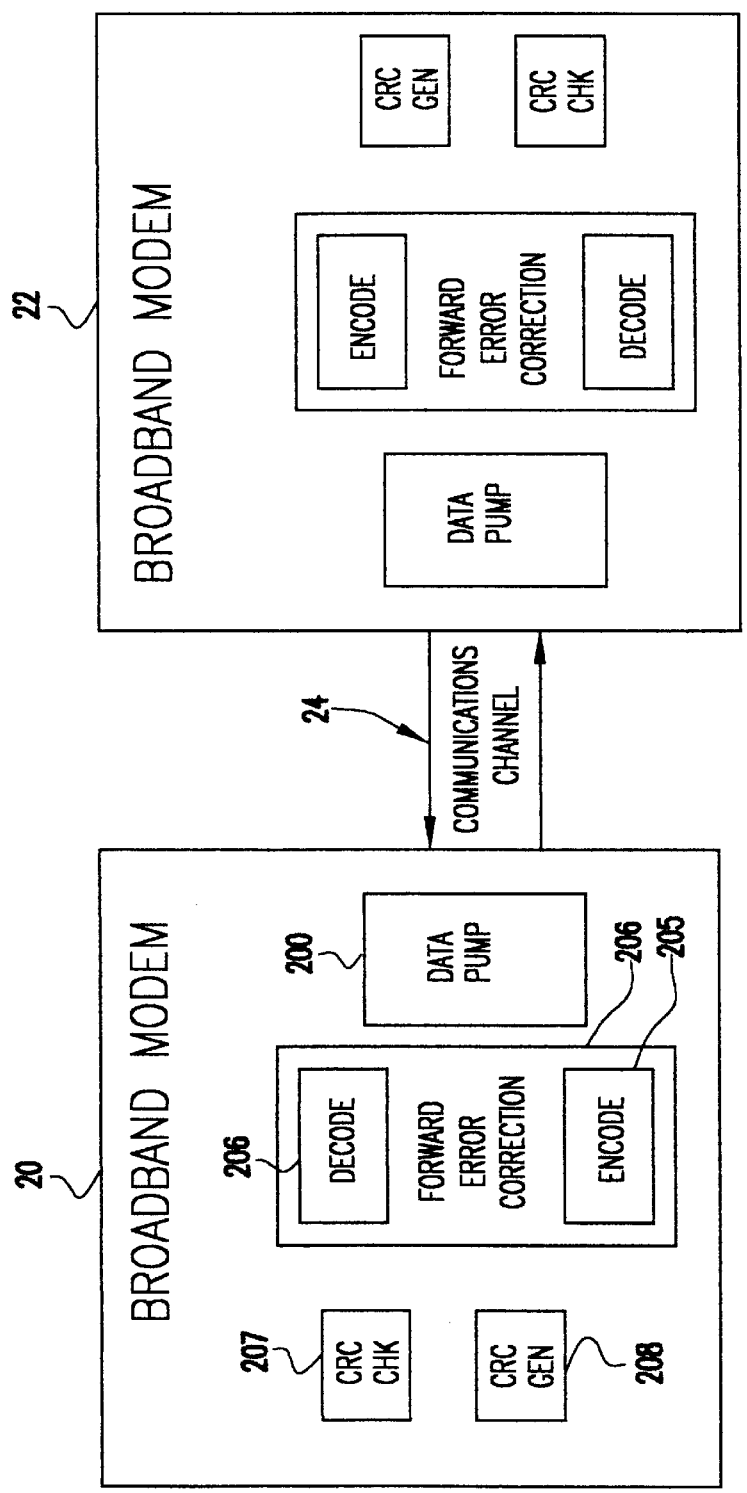
FIG. 2 is a block diagram of a broadband modem system using Forward Error Control (FEC)

A broadband modem system using Forward Error Correction is illustrated in FIG. 2. Two broadband modems 20 and 22 are connected to either end of the communications channel 24, like the voice band modems shown in FIG. 1. Taking the modem 20 as typical, the broadband modems differ from the voice band modem in the use of a Forward Error Correction (FEC) method 204 having encode and decode processes 205 and 206. In addition to the FEC method 204, the broad band modem 20 uses a Cyclic Redundancy Code (CRC) check 207 and a CRC generator 208 to detect any errors which were not correctable by the FEC process 204.

Even though such systems manage to limit errors to a reasonable level relative to the data throughput required (typically one error every 5 to 10 minutes), it would be totally unacceptable to crash the connection every time an error gets through the error correction mechanism. Thus, data compression algorithms have not been used due to their dependence on error-free data. Other broadband transmission systems may achieve similar error rates without error correction because the communications channel is less hostile to the modem signals. For the same reasons, those systems have not taken advantage of data compression capabilities.

Figure 3:
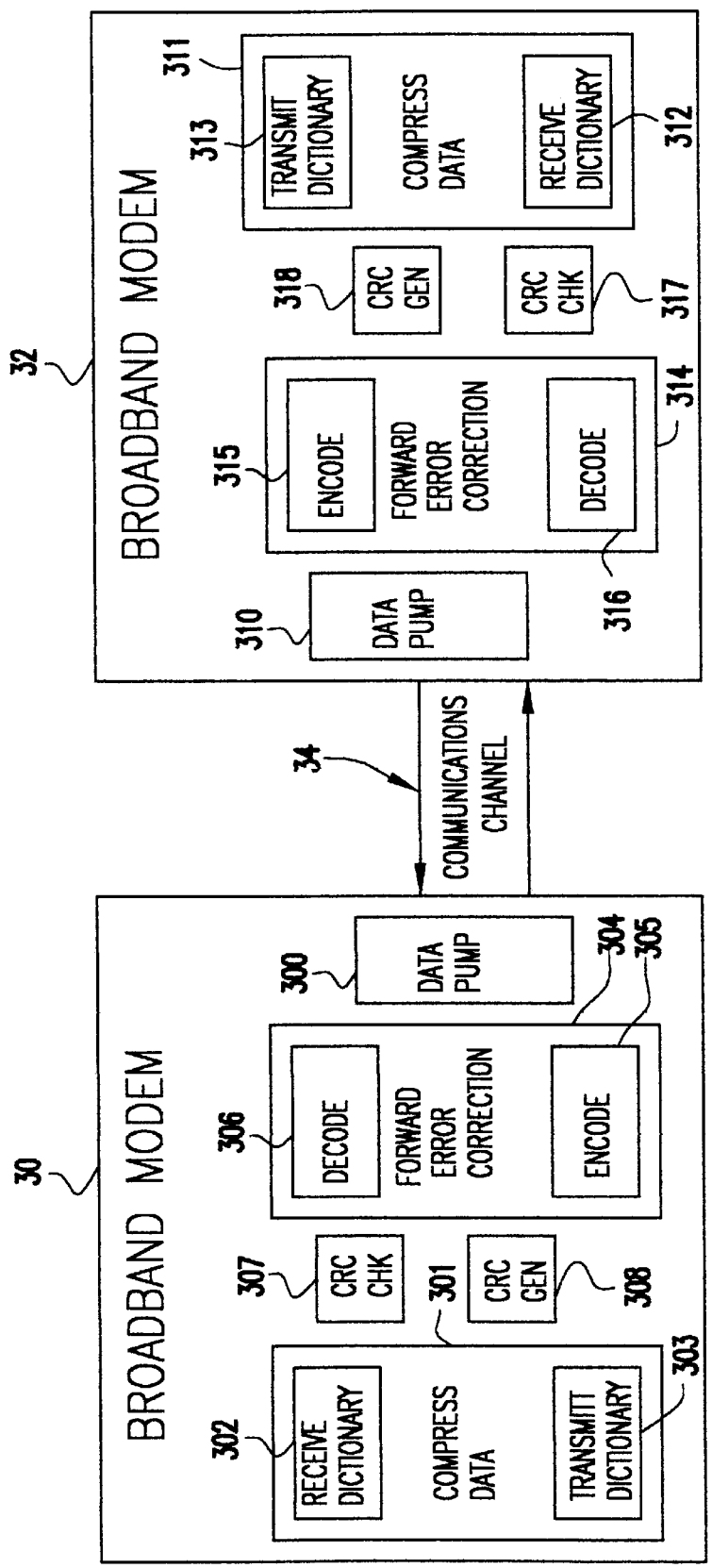
FIG. 3 is a block diagram of an enhanced broadband modem system which enables data compression according to a preferred embodiment of the invention.

FIG. 3 illustrates an enhanced implementation for a broadband modem system, which enables data compression, according to the present invention. This system is similar to that shown in FIG. 2 in that two broadband modems 30 and 32 are connected to either end of the communications channel 34. Taking the modem 30 as typical, the broadband modems according to the present invention include a Forward Error Correction (FEC) method 304 having encode and decode processes 305 and 306. In addition to the FEC method 304, the broad band modem 30 uses a Cyclic Redundancy Code (CRC) check 307 and a CRC generator 308 to detect any errors which were not correctable by the FEC process 304. The broad band modems according to the present invention differ from the broadband modem 20 of FIG. 2 in the addition of a data compression method 301 having a receive dictionary 302 and a transmit dictionary 303.

The key to making this system practical is a mechanism which allows resynchronization of transmit and receive compression dictionaries when an error is detected without disrupting the connection. Such a system would work equally well with or without error correction functions as long as the error rate remained reasonably low and specific error events can big detected (i.e., via a CRC checksum). Certainly, rates as low as one per minute would work well. At higher error rates, the overhead of re-synchronizing the compression dictionaries begins to erode the gains achieved via compression. Co-pending application Ser. No. 09/538, 204 describes such a system. The subject disclosure describes the details of a procedure for resynchronization of transmit and receive dictionaries which is robust against subsequent line errors.

A key aspect of the subject invention is that it uses Transparent Mode (TM) during the resynchronization procedure. This is significant for two reasons. First, it does not require special compression code words to accomplish the procedure. Thus, there is no reduction in the number of code words available for actual compression encoding. Second, the procedure works regardless of whether compression is being used in both directions, only one direction, or neither direction. Note that even when compression is enabled in a communications path, it may temporarily switch to Transparent Mode if the data is temporarily not compressible, thus making it critical for the re-synchronization procedure to work in Transparent Mode as well as Compressed Mode. Another key aspect of the subject invention is the definition of a new Transparent Mode Command to request that the remote modem send a RESET Command. ITU-T V.42 bis has defined several Transparent Mode Commands which are embedded within the data stream by sending an escape character (ESC), followed by the 8-bit code for the desired command. These include:

ECM=0—When detected in the received bit stream, causes the receiver to enter Compression Mode.
EID=1—Indicates that the ESC character is in the data stream. This enables ESC to flow end to end without looking like the beginning of some other Transparent Mode Command.
RESET=2—When detected in the received bit stream, causes the receiver to reset its compression dictionary. A transmitter sending this command would have to reset its transmit compression dictionary prior to sending subsequent data.

The new command is termed RRESET, and in the preferred embodiment it is associated with command code 3. If Modem B detects a CRC error in the data it receives from Modem A, Modem B receiver will signal Modem B transmitter of the Error Event. Note that the preferred embodiment assumes that the modem data pump receiver, upon detection of a CRC error, discards the affected data block without forwarding it to the receiver Data Decompression function. Thus, Modem B receiver Data Decompression function only sees the CRC error signal from the data pump, but never sees the corrupted data. This will cause Modem B transmitter to switch to Transparent Mode (if currently in Compression Mode), and to send one or more RRESET commands to initialize the resynchronization procedure. When detected in the received bit stream at Modem A, the RRESET command causes the Modem A receiver to signal the Modem A transmitter within that modem. Modem A transmitter, in response to that signal, will switch to Transparent Mode (if currently in Compression Mode), and send one or more RESET commands to Modem B which had made the request, and then reset its Transmit Compression Dictionary. When Modem B receiver detects the RESET command, it resets its Receive Compression Dictionary, so that it is in synchronization with Modem A Transmit Compression Dictionary again, thus completing the resynchronization procedure. The net result is that the Modem A Transmit Compression Dictionary and Modem B Receive Compression Dictionary are reset, but the Compression Dictionaries used for the reverse path are not affected, thus avoiding the potential of lost compression effectiveness in the reverse direction due to the recovery procedure. At the end of the resynchronization procedure, both directions of communication are left in Transparent Mode (TM).

Previously defined mechanisms (i.e., V.42 bis) will test the compression capabilities in each direction, and will switch back to Compression Mode when (and if) the data stream and dictionary contents allow it. The communications path from Modem B to Modem A will most likely switch back to Compression Mode first, since previous content of its Compression Dictionary is retained during the re-synchronization procedure, while the Compression Dictionary for sending from Modem A to Modem B is purged of any previous content as a consequence of the Reset operation. Note that this same procedure will also re-synchronize the ESC character when the modems are operating in Transparent Mode.

There are numerous additional aspects of the preferred embodiment which improve the reliability of the resynchronization procedure in the presence of additional line errors which may corrupt error recovery signaling. A new state is added to the receive state machine; this state is RX Compression Error Recovery. When a receiver detects a CRC error while in compression mode, this state is entered. This state will block reception of subsequent data (since by now the Compression Dictionaries are out of synchronization due to the CRC error), and wait for the ETM (Enter Transparent Mode) codeword from the other modem, indicating that it is starting resynchronization procedures, at which time it will transition to the RX Transparent Mode. This mode is important because if the receiver went directly into Transparent Mode to wait for the RESET command, the transmitter in the other modem will still be sending compressed data which could corrupt the receiver's ability to detect the real RESET. In other words, that compressed data could look like the RESET command, followed by a command to re-enter Compression Mode, which would totally disrupt the re-synchronization procedure.

Another new mode, called RX Transparent Error Recovery, may optionally be added. If the receiver is receiving data in RX Transparent Mode and detects an Error, the receiver may enter RX Transparent Error Recovery Mode. Operation in this mode is identical to RX Transparent Mode, except that all received data is discarded instead of being passed to the end user. If corrupted data is no worse than missing data to the end user, this state is not necessary. Note that data will most likely be corrupted even within subsequent data blocks with good CRC since the ESC character may be out of synchronism. The receiver will transition back to Transparent Mode upon receipt of either the RESET or RRESET command, both of which reset the ESC character to its initial value.

A new state is also added to the transmit state machine in the preferred embodiment to facilitate error recovery procedures; this state is TX Error Recovery Mode. This state may be entered from either TX Compression Mode or TX Transparent Mode when the modem's receiver signals it has detected an Error. Upon entry into TX Error Recovery Mode, the ESC character is initialized, and the RRESET command is sent. An optional aspect of this invention which is used in the preferred embodiment is to repeat the RRESET command some number of times N. There are two reasons for repeating the RRESET command:

1. If a subsequent data block carrying the RRESET command is also corrupted by line disturbances, continuing to repeat the command to the point where it will appear in multiple data blocks will allow the other modem to detect the command even when one data block is corrupted by line disturbances.
2. Since the ESC character is reset to Zero and the RRESET command is "00000011" in binary, the repeated command will contain 14 zeros out of every 16. In compression mode, the codeword for ETM (Enter Transparent Mode) is all zeros. Since a compression codeword may be from 9 to 14 bits for Compression Dictionaries as large as 16K entries, regardless of what the current codeword size is, if the receiver missed the ETM codeword which was specifically sent, it can recover to Transparent Mode anyway since the repeated RRESET pattern will eventually line up with codeword boundaries to appear as the ETM codeword needed to force the desired state transition.

Another optional aspect of this invention is to send one RRESET command with the old ESC character prior to transitioning from TX Transparent Mode to TX Error Recovery Mode. If the other receiver has not experienced errors, it will respond to the RRESET command with the old ESC, while if, the other receiver has been hit by errors, it will have to wait for the RRESET sent from TX Error Recovery Mode which uses the reinitialized ESC character (Zero). Another optional aspect of this invention which is used in the preferred embodiment is to repeat the RESET command some number of times N. Likewise, when sending the RESET command from Transparent Mode, it is sent one time with the old ESC character, then the ESC character is reset to Zero, and then the repeated RESET command sequence is sent with the new ESC character (Zero). This is done for the same reasons that the RRESET command is repeated. When transitioning from TX Compression Mode, the ETM codeword will be sent prior to the state machine mode switch. The transmitter will remain in the TX Error Recovery Mode until it detects that its receiver has reset its RX Compression Dictionary (indicating the completion of the synchronization procedure), at which time it will transition to the TX Transparent Mode and resume normal operations.

One aspect of this invention is that while in the TX Error Recovery Mode, the modem transmitter may maintain a timer. If the timer expires prior to completion of the resynchronization procedure, the RRESET command sequence is repeated. An optional implementation of this procedure would be to continuously send the RRESET command as long as the transmitter remains in the TX Error Recovery Mode, thus eliminating the need for the timer. However, the timer implementation is more advantageous, since it enables data transmission during the error recovery procedure. Unique to the Tx Error Recovery Mode, the ESC character is forced to remain Zero regardless of the data being transmitted. In contrast, ITU-T V.42 bis defines an algorithm which modifies the ESC character used in Transparent Mode if the current ESC character is found in the data. The original ESC character is subsequently used to send the EID (Escape In Data) command which triggers the other modem's receiver to step to the new ESC character to remain in sync. The intent of this algorithm is to eventually find an ESC character which does not appear in the data, since an 8-bit ESC character in the data expands to two 8-bit characters to send the EID command. In order for the new TX Error Recovery Mode to hold its ESC character at Zero, a new command was added to the preferred embodiment; this new command is the ZID (Zero In Data) command. The ZID command is similar to the EID command in that it enables the transmitter to encode the presence of the ESC character within the data. Unlike the EID command, the ZID command prevents the receiving modem from altering the ESC character thus maintaining a constant ESC character=Zero during the resynchronization process. Any data expansion which might occur due to zeros in the data sent during resynchronization should be insignificant since the duration of the resynchronization process is small relative to the total connection time.

Several additional Transparent Mode Commands are defined in the preferred embodiment which permit encoding of a two byte sequence in the user data into an alternate ESC Command two byte sequence. These commands are useful in avoiding another potential problem during re-synchronization. If a modem receiver detects an error while operating in Transparent Mode, it will immediately switch to RX Transparent Error Recovery Mode to wait for the other modem to respond to its request for resynchronization. During this time, the other modem's transmitter continues to send transparent data. Since the remote modem transmitter has not yet reset its ESC character, that data has the potential of appearing to the local modem receiver as a RESET command followed by one or more EID commands. Such a data pattern would allow the local modem receiver to switch back to RX Transparent Mode and continue to update the ESC character in response to perceived EID commands. Thus, when the actual RESET command is received from the other modem, it could not be recognized. In order to avoid this, all data sent in Transparent Mode is scanned for two byte sequences which look like valid command sequences when ESC is Zero. Those two byte sequences are mapped into new command sequences using the current ESC character. Note that data expansion is avoided (one two byte sequence is mapped to another two byte sequence) unless ESC happens to be zero, in which case ESC will be cycled to the next value after one occurrence. Byte sequences mapped to these new commands, called Zero Control In Data (ZCID) commands, include, but are not limited to:

00-00 ESC-05 (Zero-ECM in data)
00-00 (ESC=Zero) ESC-01-ESC-01 (EID-EID)—Normal data expansion when ESC in data
00-01 ESC-06 (Zero-EID in data)
00-01 (ESC=Zero) ESC-01-01 (EID-01)—Normal data expansion when ESC in data
00-02 ESC-07 (Zero-RESET in data)
00-03 ESC-08 (Zero-RRESET in data)

The ZID Command described above is also useful in Transparent Mode when the Transmitter processes a zero byte, but has no additional data to send. This avoids an exposure of another critical character coming into the transmitter for processing right after the zero has been passed on by itself. One additional Transparent Mode Command, XID, may optionally be added for use in negotiating compression parameters. In the preferred embodiment, a variable-length character string follows the XID command, with formatting identical to the XID message defined in ITU-T V.42 bis. A Zero-XID command may also be desirable, to avoid false detection of XID during error recovery. All these and other aspects of the current invention will become clearer when considered along with the detailed State Definitions for the Compression Receiver and Compression Transmitter, shown in the following two Tables. They are similar to the State Definitions required for ITU-T V.42 bis data compression with several notable exceptions which form the basis of this invention. The standard compression algorithm assumes an error-free link below it, thus makes no provisions for handling line errors. As seen below, when in compression mode, if an error is detected, the Receiver switches to an Error Recovery Mode, and notifies its transmitter of the error event. The RX Compression Error Recovery Mode and RX Transparent Error Recovery Mode are new modes which discards additional data it receives. Likewise, the Transmit state machine has a TX Error Recovery Mode which is used to manage the resynchronization procedure.

| Receive State | Input | Next State | Actions |
|---|---|---|---|
| RX Compression Mode | CRC or Other Error | RX Error Recovery Mode | Discard Data/Disable Dictionary Updates Disable STEPUP Signal TX SM - ERROR |
| | ETM | RX Transparent Mode | Align to byte boundary Init ESC to Zero |
| | FLUSH | Unchanged | Flush to byte boundary |
| | STEPUP | Unchanged | Increase codeword size |
| RX Transparent Mode | ESC-ECM | RX Compression Mode | Start decompressing Data |
| | ESC-EID | Unchanged | Pass Esc as data - Modify Esc |
| | ESC-ZID | Unchanged | Esc = Zero - Pass Esc as data |
| | ESC-RESET | Unchanged | Reset RX dictionary Init ESC to Zero |
| | ESC-RRESET | Unchanged | Signal TX SM - RRESET Init ESC to Zero |
| | ESC-ZECMID | Unchanged | Pass Zero-ECM as data |
| | ESC-ZEIDID | Unchanged | Pass Zero-EID as data |
| | ESC-ZRESETID | Unchanged | Pass Zero-RESET as data |
| | ESC-ZRRESETID | Unchanged | Pass Zero-RRESET as data |
| | CRC or Other Error | RX Transparent ER Mode | Discard Data Signal TX SM - ERROR Init ESC to Zero |
| RX Transparent ER Mode (ESC = Zero) | ESC-ECM | Unchanged | Discard Data |
| | ESC-EID | Unchanged | Discard Data |
| | ESC-ZID | Unchanged | Discard Data |
| | ESC-RESET | RX Transparent Mode | Reset RX dictionary Init ESC to Zero |
| | ESC-RRESET | Unchanged | Signal TX SM - RRESET Init ESC to Zero |
| | ESC-ZECMID | Unchanged | Discard Data |
| | ESC-ZEIDID | Unchanged | Discard Data |
| | ESC-ZRESETID | Unchanged | Discard Data |
| | ESC-ZRRESETID | Unchanged | Discard Data |
| | CRC or Other Error | Unchanged | Discard Data Signal TX SM - ERROR |
| RX Compression ER Mode | ETM | RX Transparent Mode | Init ESC to Zero |
| | CRC or Other Error | Unchanged | Discard Data Signal TX SM - ERROR |

| Transmit State | Input | Next State | Actions |
|---|---|---|---|
| TX Compression Mode | End of Data not byte boundary | Unchanged | Send FLUSH |
| | Larger codeword required | Unchanged | Send STEPUP |
| | Compression Not Effective | TX Transparent Mode | Send ETM Align to byte boundary Init ESC to ZERO |
| | Signal from RX - ERROR | TX Error Recovery Mode | Send ETM Align to byte boundary |
| | Signal from RX - RRESET | TX Transparent Mode | Send ETM Align to byte boundary Init ESC to ZERO Send ESC-RESET Reset TX Dictionary |
| TX Error Recovery Mode (ESC = Zero) (Timer always runs) | Upon entry | Unchanged | Init ESC to ZERO Send N x ESC-RRESET Start Timer Send Uncompressed Data |
| | ESC = Zero in TX Data | Unchanged | Send ESC-ZID (00–04) |
| | Signal from RX- RRESET | Unchanged | Send ESC-RESET until RRESET no longer rcvd. Reset TX Dictionary |
| | RX Dictionary | TX Transparent Mode | Stop Timer |

-continued

| | Reset Timer Expires OR Signal from RX - ERROR | Unchanged | Send Uncompressed Data Send N x ESC-RRESET Restart Timer Send Uncompressed Data |
|---|---|---|---|
| TX Transparent Mode Modify ESC per V.42 bis | Compression Effective | TX-Compression Mode | Send ESC-ECM Send Compressed Data |
| | ESC in TX Data | Unchanged | Send ESC-EID Modify ESC per V.42 bis |
| | Signal from RX - RRESET | Unchanged | Send ESC-RESET Init ESC to ZERO Send ESC-RESET until RRESET no longer rcvd. Reset TX Dictionary |
| | RX Dictionary Reset | Unchanged | Send Uncompressed Data |
| | Signal from RX - ERROR | TX Error Recovery Mode | Send ESC-RRESET |
| | Zero-ECM in TX data | Unchanged | Send ESC-ZECMID |
| | Zero-EID in TX data | Unchanged | Send ESC-ZEIDID |
| | Zero-RESET in TX data | Unchanged | Send ESC-ZRESETID |
| | Zero-RRESET in TX data | Unchanged | Send ESC-ZRRESETID |

To more clearly illustrate the operation of the subject invention, several scenarios are illustrated in the following tables. Scenario 1 illustrates normal error recovery in a system which is running in Compression Mode in both directions of operation.

Scenario 1 - Full Duplex Compression - normal error recovery

| MODEM A Receiver | MODEM A Transmitter | MODEM B Receiver | MODEM B Transmitter |
|---|---|---|---|
| Receive Compressed Data | Send Compressed Data | Receive Compressed Data | Send Compressed Data |
| Receive Compressed Data | Send Compressed Data | Detect CRC Error | Send Compressed Data |
| Receive Compressed Data | Send Compressed Data | Switch to Compression ER Mode (Disable Dictionary Update) (Disable Stepup) (Look for ETM) | Send ETM (0000 . . . 0)/ PAD |
| Receive ETM | Send Compressed Data | Data Ignored - (Looking for ETM) | Switch to Error Recovery Mode (Init Esc to Zero) |
| Switch to Transparent Mode (Init Esc to Zero) | Send Compressed Data | | Send Esc-RReset (0x00 03) |
| Receive Esc-RReset | | | Repeat Esc-RReset N times |
| Continue to Rcv Esc-RReset | Send ETM | | Start Timer |
| | Switch to Transparent Mode (Init Esc to Zero) | Receive ETM | Send Uncompressed Data |
| Receive Uncompressed Data | Send Esc-Reset N times (Reset TX Dictionary) | Switch to Transparent Mode (Init Esc to Zero) | Send Uncompressed Data |
| Receive Uncompressed Data | Send Uncompressed Data | Receive Esc-Reset (Reset RX Dictionary) | Stop Timer |
| | Send Uncompressed Data | Receive Uncompressed Data | Switch to Transparent Mode |
| | Send Uncompressed Data | Receive Uncompressed Data | Send Uncompressed Data |

-continued

Scenario 1 - Full Duplex Compression - normal error recovery

| MODEM A Receiver | MODEM A Transmitter | MODEM B Receiver | MODEM B Transmitter |
|---|---|---|---|
| Receive Uncompressed Data | Switch to Compressed Mode when dictionary allows it. | Receive Uncompressed Data | Switch to Compressed Mode when dictionary allows it. |

Scenario 2 illustrates how such a system recovers when subsequent CRC errors in the same modem receiver corrupt the requested resynchronization commands.

Scenario 2 - Full Duplex Compression - error recovery with lost data from A to B during recovery

| MODEM A Receiver | MODEM A Transmitter | MODEM B Receiver | MODEM B Transmitter |
|---|---|---|---|
| Receive Compressed Data | Send Compressed Data | Receive Compressed Data | Send Compressed Data |
| Receive Compressed Data | Send Compressed Data | Detect CRC Error | Send Compressed Data |
| Receive Compressed Data | Send Compressed Data | Switch to Compression ER Mode (Disable Dictionary Update) (Disable Stepup) (Look for ETM) | Send ETM (0000 . . . 0)/ PAD |
| Receive ETM | Send Compressed Data | Data Ignored - (Looking for ETM) | Switch to Error Recovery Mode (Init Esc to Zero) |
| Switch to Transparent Mode (Init Esc to Zero) | Send Compressed Data | | Send Esc-RReset (0x00 03) |
| Receive Esc-RReset | | | Repeat Esc/RReset N times |
| Continue to Rcv Esc/RReset | Send ETM | | Start Timer |
| | Switch to Transparent Mode (Init Esc to Zero) | Detect CRC Error | Send Uncompressed Data |
| Receive Uncompressed Data | Send Esc-Reset N times (Reset TX Dictionary) | | Send Esc-RReset |
| Detect Esc-RReset after data | Send Uncompressed Data | | Repeat Esc-RReset N times |
| Continue to Rcv Esc-RReset | Send Esc-Reset (Old ESC) (Init Esc to Zero) | Ignore Uncompressed Data | Send Uncompressed Data |
| Receive Uncompressed Data | Send Esc-Reset N times (Reset TX Dictionary) | Receive ETM (Esc-Reset eventually looks like ETM) Switch to Transparent Mode (Init Esc to Zero) | Send Uncompressed Data |
| Receive Uncompressed Data | Send Uncompressed Data | Receive Esc-Reset (Reset RX Dictionary) | Stop Timer |
| | Send Uncompressed Data | Receive Uncompressed Data | Switch to Transparent Mode |
| | Send Uncompressed Data | Receive Uncompressed Data | Send Uncompressed Data |
| Receive Uncompressed Data | Switch to Compressed Mode when dictionary allows it. | Receive Uncompressed Data | Switch to Compressed Mode when dictionary allows it. |

Scenario 3 illustrates how the same system recovers when subsequent CRC errors in the other modem's receiver prevent it from receiving the request for resynchronization. An interesting aspect of Scenario 3 is that both modems switch into an error recovery mode.

Scenario 3 - Full Duplex Compression -
error recovery with lost data from B to A during recovery

| MODEM A Receiver | MODEM A Transmitter | MODEM B Receiver | MODEM B Transmitter |
|---|---|---|---|
| Receive Compressed Data | Send Compressed Data | Receive Compressed Data | Send Compressed Data |
| Receive Compressed Data | Send Compressed Data | Detect CRC Error | Send Compressed Data |
| Receive Compressed Data | Send Compressed Data | Switch to Compression ER Mode (Disable Dictionary Update) (Disable Stepup) (Look for ETM) | Send ETM (0000 . . . 0)/ PAD |
| Detect CRC Error | Send Compressed Data | Data Ignored - (Looking for ETM) | Switch to Error Recovery Mode (Init Esc to Zero) |
| Switch to Compression ER Mode (Disable Dictionary Update) (Disable Stepup) (Look for ETM) | Send ETM (0000 . . . 0)/ PAD | | Send Esc-RReset (0x00 03) |
| Data Ignored - (Looking for ETM) | Switch to Error Recovery Mode (Init Esc to Zero) | Receive ETM | Repeat Esc-RReset N times |
| | Send Esc-RReset (0x00 03) | Switch to Transparent Mode (Init Esc to Zero) | Start Timer |
| | Repeat Esc-RReset N times | Receive Esc-RReset | Send Uncompressed Data |
| Data Ignored | Start Timer | Continue to Rcv Esc-RReset | Send Esc-Reset |
| Receive ETM (Esc-Reset eventually looks like ETM) (Reset TX Dictionary) Switch to Transparent Mode (Init Esc to Zero) | Send Uncompressed Data | | Continue Sending Esc-Reset (Reset TX Dictionary) |
| Receive Esc-Reset (Reset RX Dictionary) | Send Uncompressed Data | Receive Uncompressed Data | Send Uncompressed Data |
| Receive Uncompressed Data | Switch to Transparent Mode Stop Timer | Receive Uncompressed Data | Send Uncompressed Data |
| Receive Uncompressed Data | Send Uncompressed Data | | Timer Expires |
| | Send Uncompressed Data | Receive Uncompressed Data | Send Esc-RReset (0x00 03) |
| Receive ETM if still in compression Error Recovery Mode (Esc-RReset eventually looks like ETM) (Already in TM from recovery in other direction) | Send Uncompressed Data | Receive Uncompressed Data | Repeat Esc-RReset N times |
| Receive Esc-RReset | Send Uncompressed Data | Receive Uncompressed Data | Restart Timer |
| Continue to Rcv Esc-RReset | Send Esc-Reset (Old ESC) (Init Esc to Zero) | Receive Uncompressed Data | Send Uncompressed Data |
| Receive Uncompressed Data | Send Esc-Reset N times (Reset TX Dictionary) | Receive Esc-Reset (Init Esc to Zero) (Reset RX Dictionary) | Send Uncompressed Data |
| Receive Uncompressed Data | Send Uncompressed Data | Receive Esc-Reset (Reset RX Dictionary) | Switch to Transparent Mode Stop Timer |
| | Send Uncompressed Data | Receive Uncompressed Data | Send Uncompressed Data |

Scenario 3 - Full Duplex Compression - error recovery with lost data from B to A during recovery

| MODEM A Receiver | MODEM A Transmitter | MODEM B Receiver | MODEM B Transmitter |
|---|---|---|---|
| Receive Uncompressed Data | Switch to Compressed Mode when dictionary allows it. | Receive Uncompressed Data | Switch to Compressed Mode when dictionary allows it. |

Scenario 4 illustrates normal error recovery in a system which is running in compression mode in only one direction of operation (from Modem A to Modem B).

Scenario 4 - Simplex Compression (A to B) - normal error recovery

| MODEM A Receiver | MODEM A Transmitter | MODEM B Receiver | MODEM B Transmitter |
|---|---|---|---|
| Receive Uncompressed Data | Send Compressed Data | Receive Compressed Data | Send Uncompressed Data |
| Receive Uncompressed Data | Send Compressed Data | Detect CRC Error | Send Uncompressed Data |
| Receive Uncompressed Data | Send Compressed Data | Switch to Compression ER Mode (Disable Dictionary Update) (Disable Stepup) (Look for ETM) | Send Uncompressed Data |
| Receive Uncompressed Data | Send Compressed Data | Data Ignored - (Looking for ETM) | Send Esc-RReset (Old ESC) |
|  | Send Compressed Data |  | Switch to Error Recovery Mode (Init Esc to Zero) |
| Receive Esc-RReset (Init Esc to Zero) |  |  | Repeat Esc-RReset N times |
| Continue to Rcv Esc-RReset | Send ETM |  | Start Timer |
|  | Switch to Transparent Mode (Init Esc to Zero) | Receive ETM | Send Uncompressed Data |
| Receive Uncompressed Data | Send Esc-Reset N times (Reset TX Dictionary) | Switch to Transparent Mode (Init Esc to Zero) | Send Uncompressed Data |
| Receive Uncompressed Data | Send Uncompressed Data | Receive Esc-Reset (Reset RX Dictionary) | Stop Timer |
|  | Send Uncompressed Data | Receive Uncompressed Data | Switch to Transparent Mode |
|  | Send Uncompressed Data | Receive Uncompressed Data | Send Uncompressed Data |
| Receive Uncompressed Data | Switch to Compressed Mode when dictionary allows it. | Receive Uncompressed Data | Send Uncompressed Data |

Scenario 5 illustrates how such a system recovers when subsequent CRC errors in the same modem receiver corrupt the requested resynchronization commands.

Scenario 5 - Simplex Compression (A to B) - error recovery with lost data from A to B during recovery

| MODEM A Receiver | MODEM A Transmitter | MODEM B Receiver | MODEM B Transmitter |
|---|---|---|---|
| Receive Uncompressed Data | Send Compressed Data | Receive Compressed Data | Send Uncompressed Data |
| Receive Uncompressed Data | Send Compressed Data | Detect CRC Error | Send Uncompressed Data |

-continued

Scenario 5 - Simplex Compression (A to B) -
error recovery with lost data from A to B during recovery

| MODEM A Receiver | MODEM A Transmitter | MODEM B Receiver | MODEM B Transmitter |
|---|---|---|---|
| Receive Uncompressed Data | Send Compressed Data | Switch to Compression ER Mode (Disable Dictionary Update) (Disable Stepup) (Look for ETM) | Send Uncompressed Data |
| Receive Uncompressed Data | Send Compressed Data | Data Ignored - (Looking for ETM) | Send Esc-RReset (Old ESC) |
| | Send Compressed Data | | Switch to Error Recovery Mode (Init Esc to Zero) |
| Receive Esc-RReset (Init Esc to Zero) | | | Repeat Esc/RReset N times |
| Continue to Rcv Esc/RReset | Send ETM | | Start Timer |
| | Switch to Transparent Mode (Init Esc to Zero) | Detect CRC Error | Send Uncompressed Data |
| Receive Uncompressed Data | Send Esc-Reset N times (Reset TX Dictionary) | | Send Esc-RReset |
| Detect Esc-RReset after data | Send Uncompressed Data | | Repeat Esc-RReset N times |
| Continue to Rcv Esc-RReset | Send Esc-Reset (Old ESC) (Init Esc to Zero) | Ignore Uncompressed Data | Send Uncompressed Data |
| Receive Uncompressed Data | Send Esc-Reset N times (Reset TX Dictionary) | Receive ETM (Esc-Reset eventually looks like ETM) Switch to Transparent Mode (Init Esc to Zero) | Send Uncompressed Data |
| Receive Uncompressed Data | Send Uncompressed Data | Receive Esc-Reset (Reset RX Dictionary) | Stop Timer |
| | Send Uncompressed Data | Receive Uncompressed Data | Switch to Transparent Mode |
| | Send Uncompressed Data | Receive Uncompressed Data | Send Uncompressed Data |
| Receive Uncompressed Data | Switch to Compressed Mode when dictionary allows it. | Receive Uncompressed Data | Send Uncompressed Data |

Scenario 6 illustrates how the same system recovers when subsequent CRC errors in the other modem's receiver prevent it from receiving the request for resynchronization. An interesting aspect of Scenario 6 is that both modems switch into an error recovery mode.

Scenario 6 - Simplex Compression (A to B) -
error recovery with lost data from B to A during recovery

| MODEM A Receiver | MODEM A Transmitter | MODEM B Receiver | MODEM B Transmitter |
|---|---|---|---|
| Receive Uncompressed Data | Send Compressed Data | Receive Compressed Data | Send Uncompressed Data |
| Receive Uncompressed Data | Send Compressed Data | Detect CRC Error | Send Uncompressed Data |
| Receive Uncompressed Data | Send Compressed Data | Switch to Compression ER Mode (Disable Dictionary Update) (Disable Stepup) (Look for ETM) | Send Esc-RReset (Old ESC) |

| \multicolumn{4}{c}{Scenario 6 - Simplex Compression (A to B) - error recovery with lost data from B to A during recovery} |
| --- | --- | --- | --- |
| MODEM A Receiver | MODEM A Transmitter | MODEM B Receiver | MODEM B Transmitter |
|  | Send Compressed Data | Data Ignored - (Looking for ETM) | Switch to Error Recovery Mode (Init Esc to Zero) |
| Detect CRC Error | Send Compressed Data |  | Repeat Esc-RReset N times |
| Detect CRC Error | Send ETM (0000 . . . 0)/ PAD |  | Start Timer |
| Init Esc to Zero | Switch to Error Recovery Mode (Init Esc to Zero) | Receive ETM | Send Uncompressed Data |
| Receive Uncompressed Data | Send Esc-RReset (0x00 03) | Switch to Transparent Mode (Init Esc to Zero) | Send Uncompressed Data |
| Switch to Transparent ER Mode | Repeat Esc-RReset N times | Receive Esc-RReset | Send Uncompressed Data |
| Discard Data | Start Timer | Continue to Rcv Esc-RReset | Send Esc-Reset |
| Receive Esc-Reset (Init Esc to Zero) (Reset RX Dictionary) | Send Uncompressed Data |  | Continue Sending Esc-Reset (Reset TX Dictionary) |
| Receive Esc-Reset (Reset RX Dictionary) | Send Uncompressed Data | Receive Uncompressed Data | Send Uncompressed Data |
| Receive Uncompressed Data | Switch to Transparent Mode Stop Timer | Receive Uncompressed Data | Send Uncompressed Data |
| Receive Uncompressed Data | Send Uncompressed Data |  | Timer Expires |
|  | Send Uncompressed Data | Receive Uncompressed Data | Send Esc-RReset (000 03) |
| Receive Esc-RReset | Send Uncompressed Data | Receive Uncompressed Data | Repeat Esc-RReset N times |
| Continue to Rcv Esc-RReset | Send Uncompressed Data | Receive Uncompressed Data | Restart Timer |
| Switch to Transparent Mode | Send Esc-Reset (Old ESC) (Init Esc to Zero) | Receive Uncompressed Data | Send Uncompressed Data |
| Receive Uncompressed Data | Send Esc-Reset N times (Reset TX Dictionary) | Receive Esc-Reset (Init Esc to Zero) (Reset RX Dictionary) | Send Uncompressed Data |
| Receive Uncompressed Data | Send Uncompressed Data | Receive Esc-Reset (Reset RX Dictionary) | Switch to Transparent Mode Stop Timer |
|  | Send Uncompressed Data | Receive Uncompressed Data | Send Uncompressed Data |
| Receive Uncompressed Data | Switch to Compressed Mode when dictionary allows it. | Receive Uncompressed Data | Send Uncompressed Data |

Scenario 7 illustrates normal error recovery in a system which is running in Transparent Mode in both directions of operation.

| \multicolumn{4}{c}{Scenario 7 - Full-Duplex Transparent Mode - normal error recovery} |
| --- | --- | --- | --- |
| MODEM A Receiver | MODEM A Transmitter | MODEM B Receiver | MODEM B Transmitter |
| Receive Uncompressed Data | Send Uncompressed Data | Receive Uncompressed Data | Send Uncompressed Data |
| Receive Uncompressed Data | Send Uncompressed Data | Detect CRC Error | Send Uncompressed Data |
| Receive Uncompressed Data | Send Uncompressed Data | Init Esc to Zero | Send Esc-RReset (Old ESC) |
|  | Send Uncompressed Data | Switch to Transparent ER Mode Discard Data | Switch to Error Recovery Mode (Init Esc to Zero) |
| Receive Esc-RReset (Init Esc to Zero) |  |  | Repeat Esc-RReset N times |
| Continue to Rcv Esc-RReset | Send Esc-Reset (Old ESC) |  | Start Timer |

| Scenario 7 - Full-Duplex Transparent Mode - normal error recovery | | | |
|---|---|---|---|
| MODEM A Receiver | MODEM A Transmitter | MODEM B Receiver | MODEM B Transmitter |
| | (Init Esc to Zero) Send Esc-Reset N times (Reset TX Dictionary) (Init Esc to Zero) | Receive Esc-Reset (Reset RX Dictionary) (Init Esc to Zero) | Send Uncompressed Data |
| Receive Uncompressed Data | Send Uncompressed Data | Receive Esc-Reset (Reset RX Dictionary) (Init Esc to Zero) | Send Uncompressed Data |
| Receive Uncompressed Data | Send Uncompressed Data | Switch to Transparent Mode Receive Uncompressed Data | Stop Timer |
| | Send Uncompressed Data | Receive Uncompressed Data | Switch to Transparent Mode |
| | Send Uncompressed Data | Receive Uncompressed Data | Send Uncompressed Data |
| Receive Uncompressed Data | Send Uncompressed Data | Receive Uncompressed Data | Send Uncompressed Data |

Scenario 8 illustrates how such a system recovers when subsequent CRC errors in the same modem receiver corrupt the requested re-synchronization commands.

| Scenario 8 - Full-Duplex Transparent Mode - error recovery with lost data from A to B during recovery | | | |
|---|---|---|---|
| MODEM A Receiver | MODEM A Transmitter | MODEM B Receiver | MODEM B Transmitter |
| Receive Uncompressed Data | Send Uncompressed Data | Receive Uncompressed Data | Send Uncompressed Data |
| Receive Uncompressed Data | Send Uncompressed Data | Detect CRC Error | Send Uncompressed Data |
| Receive Uncompressed Data | Send Uncompressed Data | Init Esc to Zero | Send Esc-RReset (Old ESC) |
| | Send Uncompressed Data | Switch to Transparent ER Mode Discard Data | Switch to Error Recovery Mode (Init Esc to Zero) |
| Receive Esc-RReset (Init Esc to Zero) | | | Repeat Esc/RReset N times |
| Continue to Rcv Esc/RReset | Send Esc-Reset (Old ESC) (Init Esc to Zero) | | Start Timer |
| | Send Esc-Reset N times (Reset TX Dictionary) (Init Esc to Zero) | Detect CRC Error | Send Uncompressed Data |
| Receive Uncompressed Data | Send Uncompressed Data | Detect CRC Error | Send Esc-RReset |
| Detect Esc-RReset after data (Init Esc to Zero) | Send Uncompressed Data | Discard Data | Repeat Esc-RReset N times |
| Continue to Rcv Esc-RReset | Send Esc-Reset (Old ESC) (Reset TX Dictionary) (Init Esc to Zero) | Discard Data | Send Uncompressed Data |
| Receive Uncompressed Data | Send Esc-Reset N times (Reset TX Dictionary) (Init Esc to Zero) | Receive Esc-Reset (Reset RX Dictionary) (Init Esc to Zero) | Send Uncompressed Data |
| Receive Uncompressed Data | Send Uncompressed Data | Receive Esc-Reset (Reset RX Dictionary) (Init Esc to Zero) | Stop Timer Switch to Transparent Mode |
| | Send Uncompressed Data | Switch to Transparent Mode Receive Uncompressed Data | Send Uncompressed Data |
| Receive Uncompressed Data | Send Uncompressed Data | Receive Uncompressed Data | Send Uncompressed Data |

Scenario 9 illustrates how the same system recovers when subsequent CRC errors in the other modem's receiver prevent it from receiving the request for resynchronization. An interesting aspect of Scenario 9 is that both modems switch into an error recovery mode. Note that a compression disabled mode of operation could also be defined, but it would be no different than transparent mode except that the size of the compression dictionary would be zero which would prevent it from ever attempting compression mode.

that the invention can be practiced with modification within the spirit and scope of the appended claims.

Having thus described our invention, what we claim as new and desire to secure by Letters Patent is as follows:

| Scenario 9 - Full-Duplex Transparent Mode - error recovery with lost data from B to A during recovery | | | |
|---|---|---|---|
| MODEM A Receiver | MODEM A Transmitter | MODEM B Receiver | MODEM B Transmitter |
| Receive Uncompressed Data | Send Uncompressed Data | Receive Uncompressed Data | Send Uncompressed Data |
| Receive Uncompressed Data | Send Uncompressed Data | Detect CRC Error | Send Uncompressed Data |
| Receive Uncompressed Data | Send Uncompressed Data | Init Esc to Zero | Send Esc-RReset (Old ESC) |
|  | Send Uncompressed Data Discard Data | Switch to Transparent ER Mode | Switch to Error Recovery Mode (Init Esc to Zero) |
| Detect CRC Error | Send Uncompressed Data | Discard Data | Repeat Esc-RReset N times |
| Detect CRC Error | Send Esc-RReset (Old ESC) | Discard Data | Start Timer |
| Init Esc to Zero | Switch to Error Recovery Mode (Init Esc to Zero) |  | Send Uncompressed Data |
| Switch to Transparent ER Mode Discard Data | Repeat Esc-RReset N times | Receive Esc-RReset (Init Esc to Zero) | Send Uncompressed Data |
| Discard Data | Start Timer | Continue to Rcv Esc-RReset | Send Esc-Reset (Reset TX Dictionary) |
| Receive Esc-Reset (Init Esc to Zero) (Reset RX Dictionary) | Send Uncompressed Data | Switch to Transparent Mode | Continue Sending Esc-Reset (Reset TX Dictionary) |
| Receive Esc-Reset (Init Esc to Zero) (Reset RX Dictionary) | Send Uncompressed Data | Receive Uncompressed Data | Send Uncompressed Data |
| Switch to Transparent Mode Receive Uncompressed Data | Switch to Transparent Mode Stop Timer | Receive Uncompressed Data | Send Uncompressed Data |
| Receive Uncompressed Data | Send Uncompressed Data |  | Timer Expires |
|  | Send Uncompressed Data | Receive Uncompressed Data | Send Esc-RReset (0x00 03) |
| Receive Esc-RReset Data | Send Uncompressed Data | Receive Uncompressed | Repeat Esc-RReset N times |
| Continue to Rcv Esc-RReset | Send Uncompressed Data | Receive Uncompressed Data | Restart Timer |
|  | Send Esc-Reset (Old ESC) (Reset TX Dictionary) (Init Esc to Zero) | Receive Uncompressed Data | Send Uncompressed Data |
| Receive Uncompressed Data | Send Esc-Reset N times (Reset TX Dictionary) (Init Esc to Zero) | Receive Esc-Reset (Init Esc to Zero) (Reset RX Dictionary) | Send Uncompressed Data |
| Receive Uncompressed Data | Send Uncompressed Data | Receive Esc-Reset (Init Esc to Zero) (Reset RX Dictionary) | Switch to Transparent Mode Stop Timer |
|  | Send Uncompressed Data | Receive Uncompressed Data | Send Uncompressed Data |
| Receive Uncompressed Data | Send Uncompressed Data | Receive Uncompressed Data | Send Uncompressed Data |

The re-synchronization procedures of the subject invention would also be useful for a non-compression path, in that errors in the link might require resynchronization of an ESC character which is cycled algorithmically to avoid data expansion. Likewise, the re-synchronization procedures of the subject invention might also be adapted to other algorithmic encoder/decoder systems such as Encryption/Decryption.

While the invention has been described in terms of a preferred embodiment, those skilled in the art will recognize 1. In a data communications system comprising a first transceiver connected to a second transceiver through a communication channel wherein the first and second transceivers each comprise a transmitter and a receiver that employ a data encoding and decoding algorithm function, respectively, the method of re-synchronizing sets of transmitter and receiver state variables supporting the data encoding and decoding algorithm function upon detection of an error comprising the steps of:

defining a new command called the RRESET command which signals an error event;

signaling by a receiving transceiver receiver to the receiving transceiver transmitter of an error detected in data received from a transmitting transceiver;

switching by the receiving transceiver transmitter to Transparent Mode and sending one or more RRESET commands to the transmitting transceiver to initialize a re-synchronization procedure;

when the RRESET command is detected in a received bit stream at the transmitting transceiver, signaling by the transmitting transceiver receiver to the transmitting transceiver transmitter and, in response, switching by the transmitting transceiver transmitter to Transparent Mode and sending one or more RESET commands to the receiving transceiver and then resetting the transmitting transceiver's set of transmitter state variables; and when the RESET command is detected at the receiving transceiver, resetting the receiving transceiver's set of receiver state variables, so that it is in synchronization with the transmitting transceiver set of transmitter state variables, thereby completing the re-synchronization procedure so that the set of transmitter and receiver state variables used for a reverse path are not affected.

2. The method according to claim 1, further comprising the steps of:

generating a Cyclic Redundancy Coding (CRC) checksum on encoded data at the transmitting transceiver; and using the CRC checksum at the receiving transceiver to detect an error in the transmitted data.

3. The method according to claim 2, further comprising the step of discarding by the receiving transceiver receiver, upon detection of a CRC error, an affected data block without forwarding it to a receiver data decoding function so that the receiver data decoding function only sees the CRC error signal, but never sees the corrupted data.

4. The method according to claim 1, wherein the encoding and decoding algorithm functions are data compressing and decompression algorithm functions, respectively, and the sets of transmitter and receiver state variables are transmitter and receiver compression dictionaries, respectively.

5. The method according to claim 4, further comprising the steps of:

testing compression capabilities in each direction on the communication channel; and switching to Compression Mode when, and if, the data stream and dictionary contents allow it.

6. The method according to claim 4, wherein the communication system operates in full duplex compression mode.

7. The method according to claim 6, wherein the communication system operates in full duplex transparent mode after error recovery until a return is made to full duplex compression mode.

8. The method according to claim 4, wherein the communication system operates in simplex unidirectional compression mode in one direction only.

9. The method according to claim 1, further comprising the steps of:

adding a new state to state machines controlling the receivers of the first and second transceivers, the new state being RX Error Recovery Mode and is entered when a transceiver's receiver detects and error event; and upon entering the RX Error Recovery Mode, notifying the transmitting transceiver of an error and switching to an RX Transparent Error Recovery Mode.

10. The method according to claim 9, further comprising the steps of:

defining new commands, called Zero Control In Data (ZCID) commands;

mapping sequences into new command sequences using a current ESC character;

if a receiver of one transceiver detects an error while operating in Transparent Mode, immediately switching to RX Transparent Error Recovery Mode by that transceiver and waiting for the other transceiver to respond to its request for resynchronization; and scanning for sequences which look like valid command sequences when ESC is Zero to avoid switching back to RX Transparent Mode before the other transceiver responds to its request for resynchronization.

11. The method according to claim 9, further comprising the steps of:

adding a new state to state machines controlling the transmitters of the first and second transceivers, the new state being TX Error Recovery Mode and is entered when a transceiver's receiver detects an error event;

upon entering the TX Error Recovery Mode, initializing an ESC character before sending a series of RRESET commands; and maintaining the ESC character in an initialized state while in the TX Error Recovery Mode.

12. The method according to claim 11, further comprising the step of defining a new command, the Zero In Data (ZID) command, similar to an EID (ESC In Data) command, the ZID command preventing the receiving transceiver from altering the ESC character thereby maintaining the ESC character in the initialized state.

13. The method according to claim 11, further comprising the step of sending one RRESET command with an old ESC character prior to transitioning to the TX Error Recovery Mode.

14. The method according to claim 13, further comprising the steps of:

sending the RESET command one time with the old ESC character;

initializing the ESC character; and sending the RESET command a number of times with the new ESC character.

15. A data communications system comprising:

a first transceiver;

a second transceiver;

a communication channel connecting said first and second transceivers;

wherein the first and second transceivers each comprise a transmitter and a receiver that employ a data encoding and decoding algorithm function, respectively; and re-synchronizing means in each of said first and second transceivers for re-synchronizing sets of transmitter and receiver state variables supporting the data encoding and decoding algorithm function upon detection of an error, a receiving transceiver receiver signaling to the receiving transceiver transmitter of an error detected in data received from a transmitting transceiver and the receiving transceiver transmitter switching to Transparent Mode and sending a new command called the RRESET command which signals an error event, one or more RRESET commands being sent to the transmitting transceiver to initialize the re-synchronization means at the transmitting transceiver, signaling by the transmitting transceiver receiver to the transmitting transceiver transmitter when the RRESET command is detected in a received bit stream at the transmitting transceiver, and switching by the transmitting transceiver transmitter to Transparent Mode and sending one or more RESET commands to the receiving transceiver and then resetting the transmitting transceiver's set of transmitter state variables, and resetting the receiving transceiver's set of receiver state variables when the RESET command is detected at the receiving transceiver, so that it is in synchronization with the transmitting transceiver set of transmitter state variables, thereby completing re-synchronization so that the set of transmitter and receiver state variables used for a reverse path are not affected.

16. The data communication system according to claim 15, further comprising:

a Cyclic Redundancy Coding (CRC) checksum generator generating a CRC checksum on encoded data at the transmitting transceiver; and a CRC checksum check at the receiving transceiver to detect an error in the transmitted data.

17. The data communication system according to claim 16, further comprising means discarding an affected data block without forwarding it to a receiver data decoding function, upon detection of a CRC error, so that the receiver data decoding function only sees the CRC error signal, but never sees the corrupted data.

18. The data communication system according to claim 17, wherein the data encoding and decoding algorithm functions are data compression and decompression algorithm functions, respectively, and the sets of transmitter and receiver state variables are transmitter and receiver compression dictionaries, respectively.

* * * * *